United States Patent
Krysztofiak et al.

(10) Patent No.: US 12,424,944 B2
(45) Date of Patent: Sep. 23, 2025

(54) METHOD FOR FIXING AN OUTPUT POWER LIMIT OF A FREQUENCY CONVERTER AND A METHOD FOR DIAGNOSING CONDITIONS OF DC-LINK CAPACITORS

(71) Applicant: ABB Schweiz AG, Baden (CH)

(72) Inventors: Piotr Krysztofiak, Rawa Mazowiecka (PL); Artur Falkowski, Cracow (PL)

(73) Assignee: ABB Schweiz AG, Baden (CH)

( * ) Notice: Subject to any disclaimer, the term of this patent is extended or adjusted under 35 U.S.C. 154(b) by 307 days.

(21) Appl. No.: 18/326,315

(22) Filed: May 31, 2023

(65) Prior Publication Data
US 2023/0396149 A1    Dec. 7, 2023

(30) Foreign Application Priority Data

Jun. 1, 2022   (EP) ..................... 22176628

(51) Int. Cl.
*H02M 5/458* (2006.01)
*G01R 31/00* (2006.01)
(Continued)

(52) U.S. Cl.
CPC ............ *H02M 5/458* (2013.01); *H02M 1/32* (2013.01); *G01R 31/00* (2013.01); *H02M 1/15* (2013.01); *H02M 7/539* (2013.01)

(58) Field of Classification Search
CPC ............ H02M 1/14; H02M 1/15; H02M 1/32; H02M 5/458; H02M 7/53871; H02M 7/539; G01R 31/00; G01R 31/64
See application file for complete search history.

(56) References Cited

U.S. PATENT DOCUMENTS 3,125,720 A    3/1964    Swift
4,805,063 A    2/1989    Kataoka et al.
(Continued)

OTHER PUBLICATIONS

Vogelsberger et al., "Life-Cycle Monitoring and Voltage-Managing Unit for DC-Link Electrolytic Capacitors in PWM Converters," in IEEE Transactions on Power Electronics, vol. 26, No. 2, pp. 493-503, Feb. 2011, doi: 10.1109/TPEL.2010.2059713. (Year: 2011).*

(Continued)

*Primary Examiner* — Fred E Finch, III
(74) *Attorney, Agent, or Firm* — Leydig, Voit & Mayer, Ltd.

(57) ABSTRACT

A method for fixing an output power limit of a frequency converter includes determining voltage differences between two DC-link circuit capacitors for each of two different values of an output power of a frequency converter; determining a percentile value for each voltage difference by rejecting values higher than the determined percentile. A method also includes comparing a value of an output power limit $P_{outlimit}$ of a frequency converter which is fixed; assessing conditions of the DC-link capacitors, wherein when the value of the nominal power $P_n$ is higher than the fixed output power limit $P_{outlimit}$ the frequency converter is used conditionally with the power $P_i$ lower than the fixed output power limit $P_{outlimit}$ without replacement of the at least two DC-link capacitors or at least two blocks of DC-link capacitors, where i=(1, 2 . . . , n).

11 Claims, 3 Drawing Sheets

(51) Int. Cl.
*H02M 1/15* (2006.01)
*H02M 1/32* (2007.01)
H02M 7/539 (2006.01)

(56) References Cited

U.S. PATENT DOCUMENTS

| | | | |
|---|---|---|---|
| 6,211,684 | B1 | 4/2001 | McKee et al. |
| 10,014,792 | B2 * | 7/2018 | Voegeli .................. H02M 1/16 |
| 2002/0085397 | A1 | 7/2002 | Suzui et al. |
| 2012/0153965 | A1 | 6/2012 | Huang |
| 2015/0311853 | A1 * | 10/2015 | Swamy .................. H02M 1/15 |
| | | | 318/504 |
| 2021/0091681 | A1 * | 3/2021 | Abuelnaga .......... H02M 5/4585 |

OTHER PUBLICATIONS

European Patent Office, Extended European Search Report in European Patent Application No. 22176628.0, 7 pp. (Nov. 8, 2022).

* cited by examiner

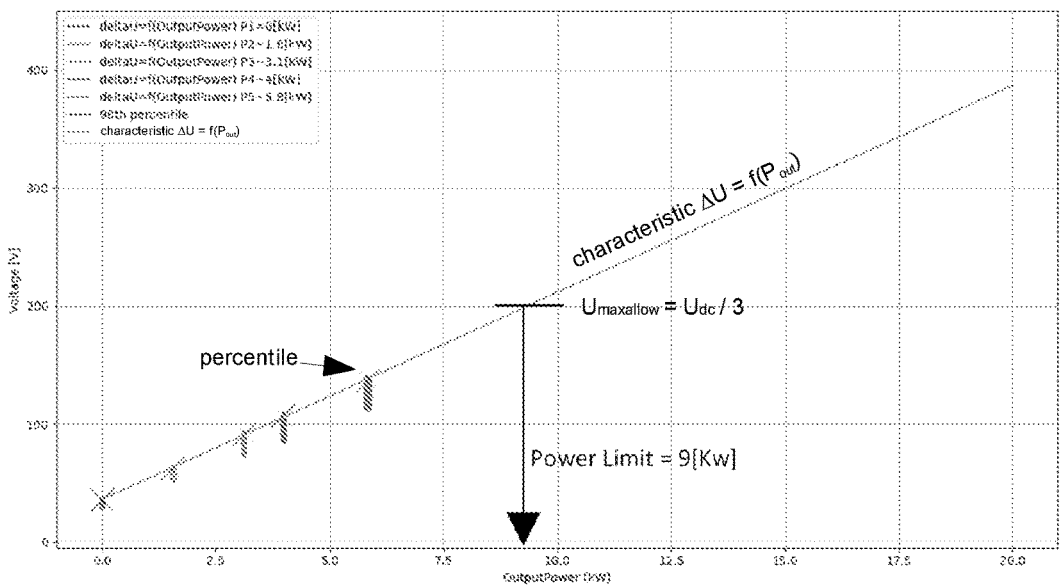

Comparing a value of an output power limit $P_{outlimit}$ of a frequency converter comprising at least two DC-link capacitors ($C_1$, $C_2$) or at least two blocks of DC-link capacitors with a value of a nominal power $P_n$ of the frequency converter

202

Assessing conditions of DC-link capacitors, wherein if the value of the nominal power $P_n$ is higher than the fixed output power limit $P_{outlimit}$ the frequency converter is used conditionally with the nominal power $P_i$ lower than the fixed output power limit $P_{outlimit}$ without replacement of the at least two DC-link capacitors ($C_1$, $C_2$) or at least two blocks of DC-link capacitors, where i = (1,2...,n)

Fig. 3

METHOD FOR FIXING AN OUTPUT POWER LIMIT OF A FREQUENCY CONVERTER AND A METHOD FOR DIAGNOSING CONDITIONS OF DC-LINK CAPACITORS

CROSS-REFERENCE TO RELATED APPLICATIONS

The present patent application claims priority to European Patent Application No. 22176628.0, filed on Jun. 1, 2022, which is incorporated herein in its entirety by reference.

FIELD OF THE DISCLOSURE

The present disclosure generally relates to a method for fixing an output power limit of a frequency converter and a method for diagnosing conditions of DC-link capacitors.

BACKGROUND OF THE INVENTION

Nowadays frequency converters have a key role in a control of electric engines, for example electric engines used in power plants which have to run 24 hours per day and 7 days per week. They allow, in particular, adjusting speed of controlled electric engines to actual needs of their users. Operation of electric engines with adjusted speed leads to energy savings in comparison to operation of the electric engines with nominal speed. That's why it is important for installations equipped with frequency converters to provide reliable and uninterrupted operation of said frequency converters.

To fulfil mentioned requirements, a proper monitoring of frequency converters' components is essential since different kinds of frequency converters' components are designed to operate for different time periods. Moreover, different components have different modes of ageing. Among all the components used within said frequency converters, DC-link capacitors have the smallest resistance against an ageing process. Their aging process depends on a number of factors like their temperature, ambient humidity, atmospheric pressure, vibrations, operating voltage, ripple current or charge-discharge cycles. For example, for electrolytic capacitors, which are the most commonly used capacitors in DC-links of frequency converters, the most crucial influences on a speed of their ageing process are ripple current and their temperature. The value of the ripple current affects the heat generated in the electrolytic capacitors. In turns, the temperature inside each electrolytic capacitor depends on ambient temperature and power, so indirectly on heat as well, dissipated inside such capacitor. Furthermore, said DC-link capacitors have parameter called Failure In Time (FIT) which relates to said ageing process.

The FIT parameter changes with time and follows a bathtub curve, which comprises three periods: early failures when the FIT parameter is decreasing, random failures when the FIT parameter is constant, and wear out failures when the FIT parameter is increasing. In a new frequency converter DC-link capacitors are in random failures period. After using them for a time each of those capacitors enters a wear-out failure mode. The wear-out failure mode means that the electrical parameters of the capacitors gradually deteriorate and the capacitor fails. In said mode the FIT parameter is no longer valid what means that the capacitors will fail more often. At the same time said DC-link capacitors play a key role in ensuring uninterrupted and reliable operation of mentioned frequency converters so it is required to plan maintenance action and replacement of those capacitors more often than other components if necessary. Thereby, the biggest difficulty that arises in the case of frequency converters when trying to ensure their reliable operation is an estimation of time for DC-link capacitors replacement by new ones. A proper estimation allows for providing installations equipped with reliable operating frequency converters. Usually, frequency converters work uninterrupted till their failure so when such estimations are made they usually have a big margin for safety and changing condition of work.

From U.S. Pat. No. 3,125,720 it is known a capacitor fault monitor for indicating a short circuit in a multi-section capacitor or a number of capacitors connected in series. Said capacitor fault monitor comprises a voltage divider, wherein the voltage divider comprises resistors connected in series. Said resistors are connected in parallel with said sections of the capacitor or the capacitors connected in series. The capacitor fault monitor is adopted to detect any voltage change across said capacitors to indicate a faulty capacitor.

U.S. Pat. No. 4,805,063 discloses a fault detector for detecting faults in a DC capacitor circuit connected to the DC buses of an inverter circuit using semiconductor device for converting direct current into alternating current to suppress the voltage pulsation. The fault detector comprises a plurality of parallel-connected capacitor circuits each having a plurality of series-connected DC capacitors, and comparison means connected to the junctions of the series-connected DC capacitors to compare the respective potentials of the parallel-connected capacitor circuits and detects the short-circuit and time-ageing of the DC capacitors of the parallel-connected capacitor circuits rapidly on the basis of the output signal of the comparison means.

Furthermore, U.S. Pat. No. 6,211,684 discloses a capacitor comprising a housing, a first plurality of capacitor sections in a first series within the housing, a second plurality of capacitor sections in a second series within the housing, a first electrode coupled to a first terminal of the first series and a first terminal of the second series, wherein the first electrode is electrically contactable outside the housing; and a second electrode coupled to a second terminal of the first series and a second terminal of the second series, wherein the second electrode is contactable outside the housing. The capacitor comprises further a voltage unbalance detection circuit containing a voltage detector and a threshold circuit. The voltage detector is interposed between a node of the first series of the capacitor sections and a node of the second series of the capacitors in order to measure a voltage between the nodes of two parallel series constituting two parallel current paths. The voltage detector provides an output signal to the threshold circuit. The threshold circuit is configured to generate an unbalance detection signal at the unbalance detection output as a function of the voltage indicated by the voltage detector. The signal output is configured to transmit an output signal to outside the housing.

BRIEF SUMMARY OF THE INVENTION

Although the above-cited patent literature discloses solutions for detection of anomalous conditions of capacitors and even solutions for detection of deterioration of capacitors in use, none of these solutions provides an assessment of the reliability of DC-link circuit capacitors. Furthermore, none of these solutions provides the possibility of operating frequency converters with ageing DC-link circuit capacitors without replacing such capacitors until the scheduled service date of such devices leading as a consequence to their operation with a high risk of failure.

Therefore, in one aspect, the present disclosure describes a method for allowing assessment of the reliability of DC-link circuit capacitors and consequently prediction of duration of reliable operation of a frequency converter comprising such DC-link circuit capacitors, and further a method allowing operation of a frequency converter with aging DC-link circuit capacitors without replacing such capacitors until the scheduled service date of such device synergistically leading to failure-free operation of such device and its higher reliability comparing to the solutions known from the prior art.

In other aspects, the present disclosure describes a simple and relatively inexpensive and convenient system and method for determining a faulty capacitor in an electrical circuit, and/or for detecting short-circuit in a capacitor to prevent an explosion in the capacitor. Such systems and methods may also provide a fault detector capable of instantaneous detection of the anomalous condition of a DC capacitor circuit, such as an internal short-circuit, and capable of detection of the deterioration of the DC capacitors in performance, attributable to time aging. An early detection or a pre-detection of an incipient capacitor failure without shutdown of the capacitor is described. The present disclosure enables capacitors with early detected minor faults to continue operation until repairs are scheduled without unnecessary interruptions.

In a more particular aspect, the present disclosure describes a computer-implemented method for fixing an output power limit of a frequency converter comprising the following steps: determining voltage differences $\Delta U_i$ between at least two DC-link circuit capacitors or at least two blocks of DC-link circuit capacitors for each of at least two different values of an output power $P_{out(i)}$ of a frequency converter, thus providing at least two sets of the voltage differences $\Delta U_i$, where i=(1, 2 ..., n), wherein the voltage differences $\Delta U_i$ are determined during stable thermal conditions of the frequency converter; determining a percentile value for each set of the voltage differences $\Delta U_i$ in order to eliminate the highest errors occurring during determination of voltage differences $\Delta U_i$, wherein the elimination occurs through rejection of values higher than the determined percentile, where i=(1, 2 ..., n); determining characteristic $\Delta U=f(P_{out})$ from the values of the percentile, determining a maximum allowable voltage difference $\Delta U_{maxallow}$, where $\Delta U_{maxallow}=\frac{1}{3} \cdot U_{dc}$, where $U_{dc}$—a voltage of a DC-link circuit; fixing (105) a value of an output power limit $P_{outlimit}$ of the frequency converter for the determined maximum allowable voltage difference $\Delta U_{maxallow}$.

BRIEF DESCRIPTION OF THE SEVERAL VIEWS OF THE DRAWING(S)

FIG. 2 is a diagram representing characteristic $\Delta U=f(P_{out})$ with a fixed value of output power limit $P_{outlimit}$ of the frequency converter in accordance with the disclosure.

FIG. 3 is a flowchart of a computer-implemented method for diagnosing conditions of DC-link capacitors in accordance with the disclosure.

DETAILED DESCRIPTION OF THE INVENTION

Figure 1:
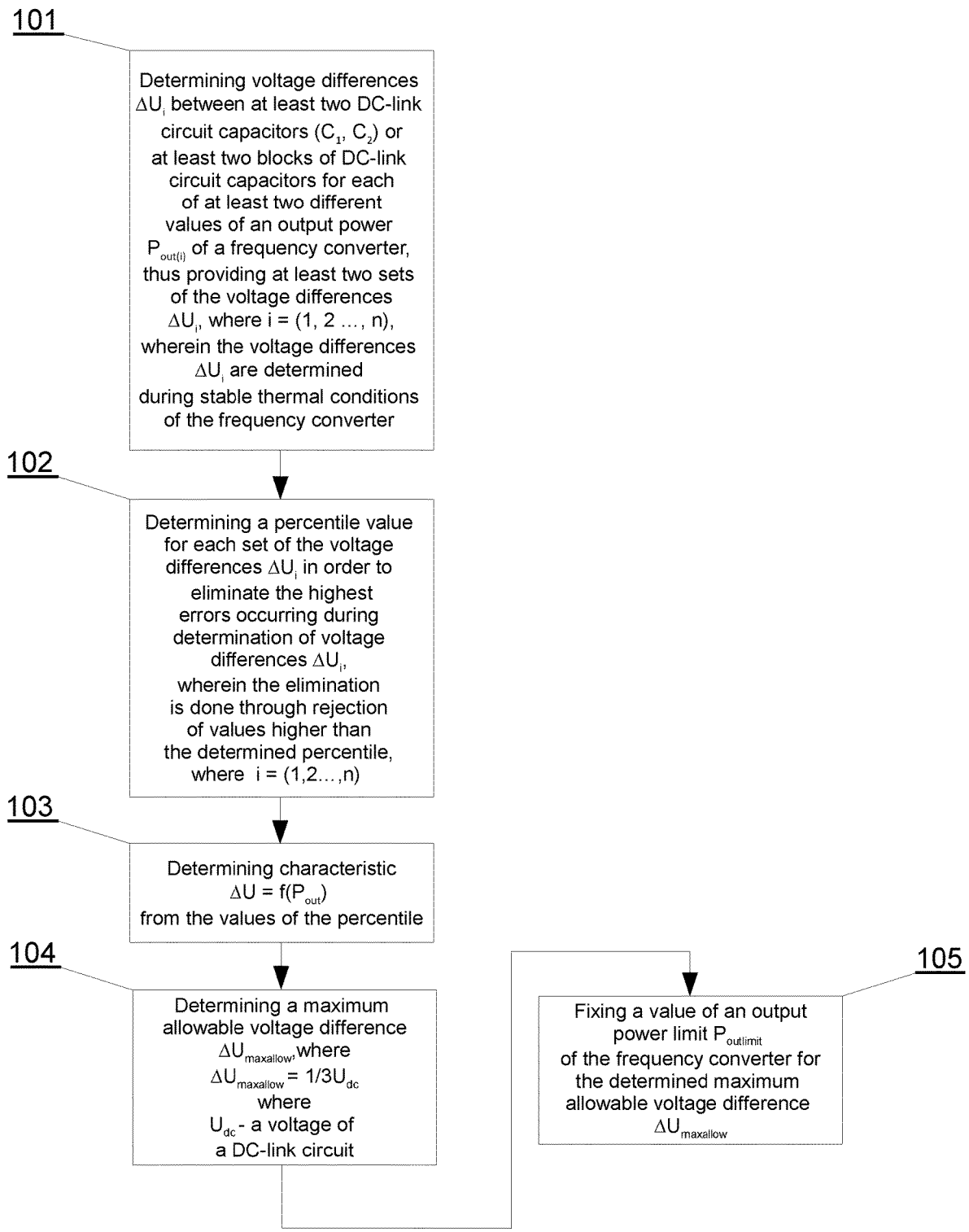
FIG. 1 is a flowchart for a computer-implemented method for fixing an output power limit of a frequency converter in accordance with the disclosure.

A computer-implemented method for fixing an output power limit of a frequency converter is shown in FIG. 1. In a first step 101 of a computer-implemented method for fixing an output power limit of a frequency converter voltage differences $\Delta U_i$ between two DC-link circuit capacitors $C_1$, $C_2$ for each of five different values of an output power $P_{out(i)}$ of a frequency converter, where i=(1, 2 ..., n), are determined. As the example the following values are given: $P_{out(1)}=0$ kW, $P_{out(2)}=1.6$ kW, $P_{out(3)}=3.1$ kW, $P_{out(4)}=4$ kW, $P_{out(5)}=5.8$ kW (FIG. 2). The DC link circuit capacitors $C_1$, $C_2$ are electrolytic capacitors.

The application of electrolytic capacitors leads to reduction of production costs of the frequency converter and at the same time provides an appropriate level of reliability of the frequency converter. The voltage differences $\Delta U_i$ are determined during stable thermal conditions of the frequency converter. The determination of the voltage differences $\Delta U_i$ can be realized by measuring these values on the DC-link circuit capacitors $C_1$, $C_2$. Such determination leads to providing five sets of the voltage differences $\Delta U_i$.

Next, in order to eliminate the highest errors occurring during the determination of the voltage differences $\Delta U_i$ a value of $98^{th}$ percentile for each set of the voltage differences $\Delta U_i$ is determined 102. The elimination of the highest errors is done through rejection of values of the voltage differences $\Delta U_i$ which are higher than the value of determined percentile. In the next step 103 characteristic $\Delta U=f(P_{out})$ from the values of the percentile is determined. After that, a maximum allowable voltage difference $\Delta U_{maxallow}$ is determined 104, where $$\Delta U_{maxallow}=\frac{1}{3} \cdot U_{dc}$$

where $U_{dc}$ represents a voltage of a DC-link circuit.

Finally, a value of an output power limit $P_{outlimit}$ of the frequency converter for the determined maximum allowable voltage difference $\Delta U_{maxallow}$ is fixed 105 with a margin of an error factor $F_{me}$ of 0.9. The application of the disclosed method allows operation of the frequency converter with ageing DC link circuit capacitors without replacing such capacitors until the scheduled service date. In turn, the application of the margin of the error factor $F_{me}$, wherein $0<F_{me}<1$, in particular when the margin of the error factor $F_{me}$ is 0.9, improves the safety of frequency converter operation at limited output power. Moreover, the application of the percentile of $98^{th}$ further improves accuracy of fixing the output power limit $P_{outlimit}$. Furthermore, in the step of determining 101 voltage differences $\Delta U_i$, 100 samples of the voltage differences $\Delta U_i$ are determined. The determination of 100 samples of the voltage differences $\Delta U_i$ improves or even ensures operation of the frequency converter with ageing DC link circuit capacitors without replacing such capacitors until the scheduled service date.

A computer-implemented method for diagnosing conditions of DC-link capacitors is shown in FIG. 3. In a first step 201 of a computer-implemented method for diagnosing conditions of DC-link capacitors a value of an output power limit $P_{outlimit}$ of a frequency converter is compared 201 with a value of a nominal power $P_n$ of the frequency converter. The value of the output power limit $P_{outlimit}$ is fixed by the computer-implemented method for fixing an output power limit of a frequency converter. In the final step 202 conditions of the DC-link capacitors $C_1$, $C_2$ are assessed, wherein if the value of the nominal power $P_n$ of the frequency converter is higher than the fixed output power limit $P_{outlimit}$ the frequency converter is used conditionally with the power $P_i$ lower than the fixed output power limit $P_{outlimit}$ without replacement of the DC-link capacitors $C_1$, $C_2$, where i=(1, 2 . . . , n).

Furthermore, the value of the output power limit $P_{outlimit}$ of the frequency converter is periodically verified and updated as the rate of change of output power limit $P_{outlimit}$ increases as the used capacitors age. As a result the change of the output power limit $P_{outlimit}$ will be faster for older capacitors. It should be noted here that these steps are important because capacitors do not age linearly.

Figure 4:
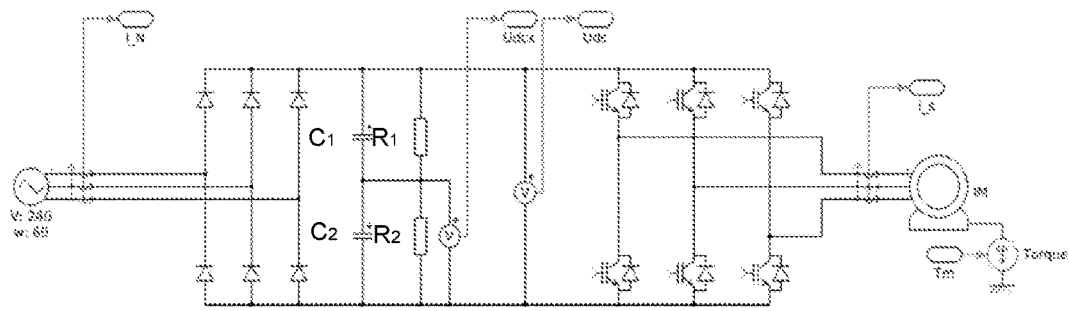
FIG. 4 is a diagram of a frequency converter according to the disclosure comprising two DC-link circuit capacitors in the wiring diagram in accordance with the disclosure.

A frequency converter is shown in FIG. 4. The frequency converter shown in FIG. 4 is configured to carry out the steps of the computer-implemented method for fixing an output power limit of a frequency converter according to the disclosure and/or the computer-implemented method for diagnosing conditions of DC-link capacitors according to the disclosure. The frequency converter is shown in FIG. 4 in wiring diagram, where $C_1$, $C_2$ are two DC-link circuit capacitors, $R_1$, $R_2$ are forming a voltage balancer, $U_{dc}$ is a voltage of a DC-link circuit and $U_{dex}$ is a voltage of a DC-link circuit midpoint.

Figure 5:
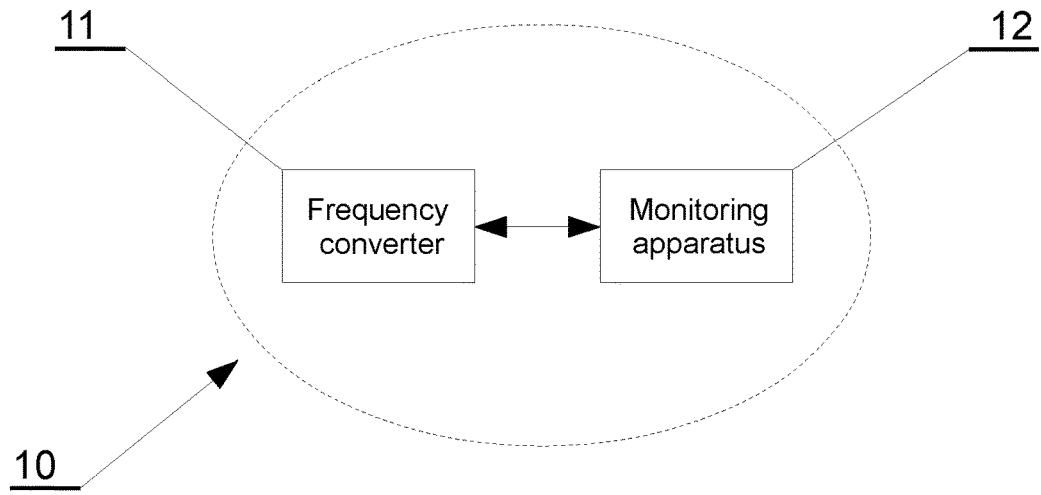
FIG. 5 is a system schematic for carrying out the steps of the method for fixing an output power limit of a frequency converter according to the disclosure and/or the method for diagnosing conditions of DC-link capacitors according to the disclosure comprising a monitoring apparatus in accordance with the disclosure.
Figure 6:
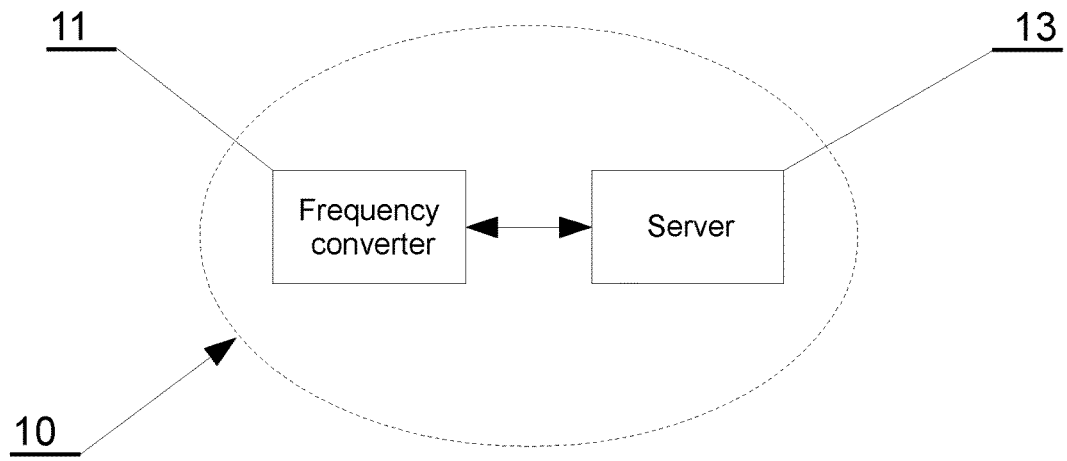
FIG. 6 is a system schematic for carrying out the steps of the method for fixing an output power limit of a frequency converter according to the disclosure and/or the method for diagnosing conditions of DC-link capacitors according to the disclosure comprising a server in accordance with the disclosure.

A system 10 for carrying out the steps of the computer-implemented method for fixing an output power limit of a frequency converter according to the disclosure and/or the computer-implemented method for diagnosing conditions of DC-link capacitors according to the disclosure comprises is shown in FIGS. 5 and 6. The frequency converter 11 and a monitoring apparatus 12 are configured to communicate with the frequency converter 11. The monitoring apparatus 12 is further configured to carry out the steps of the computer-implemented method for fixing an output power limit of a frequency converter according to the disclosure and/or the computer-implemented method for diagnosing conditions of DC-link capacitors according to the disclosure.

In another embodiment the system 10 comprises a server 13 instead of the monitoring apparatus 12. The server 13 is configured then to communicate with the frequency converter 11. The server 13 is further configured to carry out the steps of the computer-implemented method for fixing an output power limit of a frequency converter according to the disclosure and/or the computer-implemented method for diagnosing conditions of DC-link capacitors according to the disclosure. In yet another embodiment the system 10 comprises both the monitoring apparatus 12 and the server 13. In such embodiment the monitoring apparatus 12 and the server 13 are configured to communicate with the frequency converter 12 and both the monitoring apparatus 12 and the server 13 are configured to carry out the steps of the computer-implemented method for fixing an output power limit of a frequency converter according to the disclosure and/or the computer-implemented method for diagnosing conditions of DC-link capacitors according to the disclosure.

A computer program comprises program code for performing all steps of the computer-implemented method for fixing an output power limit of a frequency converter according to the disclosure and/or the computer-implemented method for diagnosing conditions of DC-link capacitors according to the disclosure, when said program is running on the monitoring apparatus 12. In another embodiment the computer program comprises means of the program code for performing all steps of the computer-implemented method for fixing an output power limit of a frequency converter according to the disclosure and/or the computer-implemented method for diagnosing conditions of DC-link capacitors according to the disclosure, when said program is running on the server 13. In yet another embodiment the computer program comprises means of the program code for performing all steps of the computer-implemented method for fixing an output power limit of a frequency converter according to the disclosure and/or the computer-implemented method for diagnosing conditions of DC-link capacitors according to the disclosure, when said program is running on the monitoring apparatus 12 and the server 13.

A computer-readable medium stores instructions for performing all the steps of the computer-implemented method for fixing an output power limit of a frequency converter according to the disclosure and/or the computer-implemented method for diagnosing conditions of DC-link capacitors according to the invention implemented on the monitoring apparatus 12. In another embodiment the computer-readable medium stores instructions for performing all the steps of the computer-implemented method for fixing an output power limit of a frequency converter according to the disclosure and/or the computer-implemented method for diagnosing conditions of DC-link capacitors according to the disclosure implemented on the server 13. In yet another embodiment the computer-readable medium stores all the steps of the computer-implemented method for fixing an output power limit of a frequency converter according to the disclosure and/or the computer-implemented method for diagnosing conditions of DC-link capacitors according to the disclosure implemented on the monitoring apparatus 12 and the server.

The computer-implemented method for fixing an output power limit allows operation of the frequency converter with ageing DC link circuit capacitors without replacing such capacitors until the scheduled service date.

In one embodiment, the output power limit $P_{outlimit}$ is fixed with a margin of an error factor $F_{me}$, wherein $0<F_{me}<1$. The margin of the error factor $F_{me}$ may be 0.9. The application of the margin of the error factor $F_{me}$, wherein $0<F_{me}<1$, in particular when the margin of the error factor $F_{me}$ is 0.9 improves the safety of frequency converter operation at limited output power.

In one embodiment, in the step of determining voltage differences $\Delta U_i$, at least 100 samples of the voltage differences $\Delta U_i$ are determined. The determination of the at least 100 samples of the voltage differences $\Delta U_i$ improves or even ensures operation of the frequency converter with ageing DC link circuit capacitors without replacing such capacitors until the scheduled service date. The percentile is of at least $75^{th}$ and, in the illustrated embodiment the percentile is of $98^{th}$. The application of the percentile of $98^{th}$ further improves accuracy of fixing the output power limit $P_{outlimit}$.

In one embodiment, the DC link circuit capacitors are electrolytic capacitors.

Further, embodiments in accordance with the disclosure include a computer-implemented method for diagnosing conditions of DC-link capacitors comprising the following steps: comparing a value of an output power limit $P_{outlimit}$ of a frequency converter comprising at least two DC-link capacitors or at least two blocks of DC-link capacitors with a value of a nominal power $P_n$ of the frequency converter, wherein the value of the output power limit $P_{outlimit}$ is fixed by the computer-implemented method for fixing an output power limit according to the disclosure; assessing conditions of the DC-link capacitors, wherein if the value of the nominal power $P_n$ is higher than the fixed output power limit $P_{outlimit}$ the frequency converter is used conditionally with the power $P_i$ lower than the fixed output power limit $P_{outlimit}$ without replacement of the at least two DC-link capacitors or at least two blocks of DC-link capacitors, where i= (1, 2 . . . , n).

The application of the computer-implemented method for diagnosing conditions of DC-link capacitors allows assessment of the reliability of the DC-link circuit capacitors and consequently prediction of duration of reliable operation of the frequency converter comprising the DC-link circuit capacitors. Accordingly, the application of both disclosed methods leads to failure-free operation of the frequency converter and its higher reliability comparing to the solutions known from the prior art. Preferably, the value of the output power limit $P_{outlimit}$ of a frequency converter is periodically verified and/or updated. Preferably, the DC-link circuit capacitors are electrolytic capacitors.

The application of electrolytic capacitors in each of the disclosed methods leads to reduction of production costs of frequency converters and at the same time provides an appropriate level of reliability of frequency converters.

The disclosure further relates a frequency converter configured to carry out the steps of the computer-implemented method for fixing an output power limit of a frequency converter according to the disclosure and/or the computer-implemented method for diagnosing conditions of DC-link capacitors according to the disclosure.

The disclosure also relates to a system for carrying out the steps of the computer-implemented method for fixing an output power limit of a frequency converter according to the disclosure and/or the computer-implemented method for diagnosing conditions of DC-link capacitors according to the disclosure comprising at least one frequency converter, at least one monitoring apparatus and/or at least one server, wherein the at least one monitoring apparatus and/or the at least one server being configured to communicate with the at least one frequency converter, wherein the at least one monitoring apparatus and/or the at least one server being further configured to carry out the steps the computer-implemented method for fixing an output power limit of a frequency converter according to the disclosure and/or the computer-implemented method for diagnosing conditions of DC-link capacitors according to the disclosure. For the purpose of the present disclosure, the term server also refers to cloud services.

Further, the disclosure relates to a computer program comprising means of the program code for performing all steps of the computer-implemented method for fixing an output power limit of a frequency converter according to the disclosure and/or the computer-implemented method for diagnosing conditions of DC-link capacitors according to the disclosure, when the said program is running on a frequency converter or monitoring apparatus and/or server.

Furthermore, a computer-readable medium storing computer-implemented instructions for performing all the steps of the computer-implemented method for fixing an output power limit of a frequency converter according to the disclosure and/or the computer-implemented method for diagnosing conditions of DC-link capacitors according to the disclosure on a frequency converter or monitoring apparatus and/or server.

The method for fixing an output power limit of a frequency converter according to the disclosure allows remote adjusting of an output power limit of a frequency converter. The method for diagnosing conditions of DC-link circuit capacitors according to the disclosure allows to estimate actual conditions of such capacitors, i.e. their degree of deterioration and indicate if they need to be replaced such that maintenance actions may be planned ahead of severe problems associated not only with frequency converters but the whole installations comprising them.

The method for diagnosing conditions of DC-link circuit capacitors according to the disclosure allows to plan maintenance work of a frequency converter based on actual conditions of the capacitors, i.e. their degree of deterioration. The method for diagnosing conditions of DC-link circuit capacitors according to the disclosure based on actual conditions of DC-link circuit capacitors allows to prepare a more detailed and accurate plan of maintenance work. The method for diagnosing conditions of DC-link circuit capacitors according to the disclosure ensures remote assessment of the capacitor's conditions. The method for diagnosing conditions of DC-link circuit capacitors according to the disclosure allows supplying to frequency converters users information on the actual condition of DC-link circuit capacitors.

The methods according to the disclosure ensure optimization of frequency converter operation and as a consequence optimization of frequency converter maintenance work leading to reduction of their maintenance costs. The methods according to the disclosure allow prediction of duration of reliable operation of a frequency converter comprising such DC-link circuit capacitors. The methods according to the disclosure allow to use electrolytic capacitors leading to reduction of production costs of frequency converters and at the same time providing an appropriate level of reliability of frequency converters.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A computer-implemented method for fixing an output power limit of a frequency converter, comprising:
    determining voltage differences $\Delta U_i$ between at least two DC-link circuit capacitors or at least two blocks of DC-link circuit capacitors for each of at least two different values of an output power $P_{out}(i)$ of a frequency converter, thus providing at least two sets of the voltage differences $\Delta U_i$, where $i=(1, 2 \ldots, n)$, wherein the voltage differences $\Delta U_i$ are determined during stable thermal conditions of the frequency converter;
    determining a percentile value for each set of the voltage differences $\Delta U_i$ in order to eliminate the highest errors occurring during determination of voltage differences $\Delta U_i$, wherein the elimination is done through rejection of values higher than the determined percentile, where $i=(1, 2 \ldots, n)$;
    determining characteristic $\Delta U = f(P_{out})$ from the values of the percentile,
    determining a maximum allowable voltage difference $\Delta U_{maxallow}$, where $$\Delta U_{maxallow} = \frac{1}{3} \cdot U_{dc}$$

where $U_{dc}$ represents a voltage of a DC-link circuit;
    fixing a value of an output power limit $P_{outlimit}$ of the frequency converter for the determined maximum allowable voltage difference $\Delta U_{maxallow}$.

2. The computer-implemented method according to claim 1, wherein the output power limit $P_{outlimit}$ is fixed with a margin of an error factor $F_{me}$, wherein $0 < F_{me} < 1$.

3. The computer-implemented method according to claim 2, wherein the margin of the error factor $F_{me}$ is 0.9.

4. The computer-implemented method according to claim 1, wherein determining voltage differences $\Delta U_i$ comprises determining at least 100 samples of the voltage differences $\Delta U_i$.

5. The computer-implemented method according to claim 1, wherein the percentile is of at least 75th.

6. The computer-implemented method according to claim 5, wherein the percentile is of 98th.

7. The computer-implemented method according to claim 1, wherein the DC link circuit capacitors are electrolytic capacitors.

8. A computer-implemented method for diagnosing conditions of DC-link capacitors, comprising:
    comparing a value of an output power limit $P_{outlimit}$ of a frequency converter comprising at least two DC-link capacitors or at least two blocks of DC-link capacitors with a value of a nominal power $P_n$ of the frequency converter, wherein the value of the output power limit $P_{outlimit}$ is fixed by:
    determining voltage differences $\Delta U_i$ between at least two DC-link circuit capacitors or at least two blocks of DC-link circuit capacitors for each of at least two different values of an output power $P_{out}(i)$ of a frequency converter, thus providing at least two sets of the voltage differences $\Delta U_i$, where $i=(1, 2 \ldots, n)$, wherein the voltage differences $\Delta U_i$ are determined during stable thermal conditions of the frequency converter;
    determining a percentile value for each set of the voltage differences $\Delta U_i$ in order to eliminate the highest errors occurring during determination of voltage differences $\Delta U_i$, wherein the elimination is done through rejection of values higher than the determined percentile, where $i=(1, 2 \ldots, n)$;
    determining characteristic $\Delta U = f(P_{out})$ from the values of the percentile,
    determining a maximum allowable voltage difference $\Delta U_{maxallow}$, where $$\Delta U_{maxallow} = \frac{1}{3} \cdot U_{dc}$$

where $U_{dc}$ represents a voltage of a DC-link circuit;
    fixing a value of an output power limit $P_{outlimit}$ of the frequency converter for the determined maximum allowable voltage difference $\Delta U_{maxallow}$;
    assessing conditions of the DC-link capacitors, wherein when the value of the nominal power $P_n$ is higher than the fixed output power limit $P_{outlimit}$ the frequency converter is used conditionally with the power $P_i$ being selected to be lower than the fixed output power limit $P_{outlimit}$ without replacement of the at least two DC-link capacitors or at least two blocks of DC-link capacitors, where $i=(1, 2 \ldots, n)$.

9. The computer-implemented method according to claim 8, wherein the value of the output power limit $P_{outlimit}$ of a frequency converter is periodically verified and/or updated.

10. The computer-implemented method according to claim 8, wherein the DC-link circuit capacitors are electrolytic capacitors.

11. A system, comprising:
    at least one frequency converter;
    at least one monitoring apparatus; and/or
    at least one server;
    wherein the at least one monitoring apparatus and/or the at least one server is configured to communicate with the at least one frequency converter;
    wherein the at least one monitoring apparatus and/or the at least one server is further configured to:
        determine voltage differences $\Delta U_i$ between at least two DC-link circuit capacitors or at least two blocks of DC-link circuit capacitors for each of at least two different values of an output power $P_{out}(i)$ of a frequency converter, thus providing at least two sets of the voltage differences $\Delta U_i$, where $i=(1, 2 \ldots, n)$, wherein the voltage differences $\Delta U_i$ are determined during stable thermal conditions of the frequency converter;
        determine a percentile value for each set of the voltage differences $\Delta U_i$ in order to eliminate the highest errors occurring during determination of voltage differences $\Delta U_i$, wherein the elimination is done through rejection of values higher than the determined percentile, where i=(1, 2 . . . , n);

determine characteristic $\Delta U=f(P_{out})$ from the values of the percentile, determine a maximum allowable voltage difference $\Delta U_{maxallow}$, where $$\Delta U_{maxallow} = \frac{1}{3} \cdot U_{dc}$$

where $U_{dc}$ represents a voltage of a DC-link circuit;

fix a value of an output power limit $P_{outlimit}$ of the frequency converter for the determined maximum allowable voltage difference $\Delta U_{maxallow}$.

* * * * *